(12) United States Patent
Yang et al.

(10) Patent No.: US 12,426,424 B2
(45) Date of Patent: Sep. 23, 2025

(54) LIGHT-EMITTING DEVICE AND METHOD FOR MAKING THE SAME

(71) Applicant: XIAMEN SAN'AN OPTOELECTRONICS CO., LTD., Tong'an District (CN)

(72) Inventors: Lixun Yang, Xiamen (CN); Jianfeng Yang, Xiamen (CN); Kuowei Ho, Xiamen (CN); Linrong Cai, Xiamen (CN); Xiaoqiang Zeng, Xiamen (CN); Shaohua Huang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 576 days.

(21) Appl. No.: 17/454,337

(22) Filed: Nov. 10, 2021

(65) Prior Publication Data

US 2022/0157883 A1    May 19, 2022

(30) Foreign Application Priority Data

Nov. 13, 2020   (CN) .......................... 202011268801.8

(51) Int. Cl.
*H10H 29/14*     (2025.01)
*G01R 31/28*     (2006.01)

(52) U.S. Cl.
CPC ......... *H10H 29/14* (2025.01); *G01R 31/2884* (2013.01)

(58) Field of Classification Search
CPC ............... H01L 27/153; H01L 33/0093; H01L 2933/0016; H01L 2933/0066; H01L 33/62; H01L 33/22; H01L 33/44; H01L 25/0753; H01L 33/382; H01L 27/156; H01L 33/38; G01R 31/2884; H10H 29/14;
(Continued)

(56) References Cited

U.S. PATENT DOCUMENTS

2005/0179042 A1 * 8/2005  Yang ...................... H01L 27/153
                                                                257/84
2007/0187712 A1 * 8/2007  Yamada .................. H01L 24/32
                                                                257/E33.068
(Continued)

FOREIGN PATENT DOCUMENTS

CN    104091867 A  * 10/2014  ........... H01L 27/153
CN    108417682 A  *  8/2018  ......... G01R 31/2635
(Continued)

*Primary Examiner* — Mohammed Shamsuzzaman
(74) *Attorney, Agent, or Firm* — Thomas Horstemeyer, LLP

(57) ABSTRACT

A light-emitting device includes a number (N) (not smaller than two) of light-emitting units, a interconnect structure connecting the light-emitting units in series, first and second electrodes, and an auxiliary electrode structure. The light-emitting units each having an light-emitting stack having first and second semiconductor layers of opposite doping types and an active layer. The first and second electrodes are respectively connected to the first semiconductor layer of a first light-emitting unit and the second semiconductor layer of an $N^{th}$ light-emitting unit. The auxiliary electrode structure is connected to the light-emitting stack of at least one of the light-emitting units.

13 Claims, 22 Drawing Sheets

(58) Field of Classification Search
CPC ............. H10H 20/857; H10H 20/032; H10H 20/8312; H10H 20/018; H10H 20/0364; H10H 20/82; H10H 20/84; H10H 29/142; H10H 20/831
See application file for complete search history.

(56) References Cited

U.S. PATENT DOCUMENTS

| | | | | |
|---|---|---|---|---|
| 2014/0217386 A1* | 8/2014 | Hayashi | ............... | H10K 50/813 257/40 |
| 2016/0020431 A1* | 1/2016 | Yamae | ................... | H10K 59/32 257/40 |

FOREIGN PATENT DOCUMENTS

| | | | | | |
|---|---|---|---|---|---|
| CN | 110444558 A | * | 11/2019 | ......... | H01L 23/4924 |
| CN | 112490260 A | * | 3/2021 | ......... | G01R 31/2884 |
| CN | 112510043 A | * | 3/2021 | ............. | H01L 27/10 |
| CN | 113228328 A | * | 8/2021 | ......... | H01L 27/3225 |
| CN | 114678453 A | * | 6/2022 | ......... | H01L 25/0753 |
| DE | 102012106131 A1 | * | 3/2013 | ............. | B32B 37/12 |
| EP | 3197244 A1 | * | 7/2017 | ......... | H01L 27/3246 |
| WO | WO-2018116814 A1 | * | 6/2018 | ............... | G09F 9/00 |

\* cited by examiner

LIGHT-EMITTING DEVICE AND METHOD FOR MAKING THE SAME

CROSS-REFERENCE TO RELATED APPLICATION

This application claims priority of Chinese Patent Application No. 202011268801.8, filed on Nov. 13, 2020.

FIELD

The disclosure relates to a semiconductor device, and more particularly to a light-emitting device and a method for making the light-emitting device.

BACKGROUND

With the continuous development of applied electronics technology, the integration of electronic circuits is becoming higher, the space available on the circuit boards is becoming more and more limited, and the reverse working voltage that the diodes have to endure is becoming higher. However, there is a limitation as to how much voltage the p-n junction in the diode can endure. Therefore, the chips on the circuit boards often need to be connected in series to divide the voltage. In order to detect possible tiny defects in the chips, reverse voltage, electrostatic pulse or other techniques are applied to the chips for testing. However, such testing can only test the chips connected in series as a unit, and cannot test a single chip in the series connection. If a single defective chip is not screened out, the entire semiconductor device containing the chips may deteriorate or even fail after long-term use.

SUMMARY

According to an aspect of this disclosure, a light-emitting device includes a substrate, a number (N) of light-emitting units, an interconnect structure, a first electrode, a second electrode, and an auxiliary electrode structure. The light-emitting units are disposed on the substrate and that are spaced apart from each other. Each of the light-emitting units has a light-emitting stack that has a first semiconductor layer, an active layer, and a second semiconductor layer which has a doping type opposite to that of the first semiconductor layer. The number (N) is not smaller than two. The interconnect structure interconnects the light-emitting units in series. The first electrode is electrically connected to the first semiconductor layer of a first one of the light-emitting units. The second electrode is electrically connected to the second semiconductor layer of an $N^{th}$ one of the light-emitting units. The auxiliary electrode structure is electrically connected to the interconnect structure, and is electrically connected to the light-emitting stack of at least one of the light-emitting units.

According to another aspect of this disclosure, a method of making a light-emitting device includes: forming a number (N) of light-emitting units and a interconnect structure, the light-emitting units being spaced apart from each other and being connected in series by the interconnect structure, each of the light-emitting units having an light-emitting stack that has a first semiconductor layer, an active layer, and a second semiconductor layer, the number (N) being not smaller than two; forming a first electrode and a second electrode, the first electrode being electrically connected to the first semiconductor layer of a first one of the light-emitting units, the second electrode being electrically connected to the second semiconductor layer of an Nth one of the light-emitting units; and forming an auxiliary electrode structure that is electrically connected to the interconnect structure, and that is electrically connected to the light-emitting stack of at least one of the light-emitting units.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
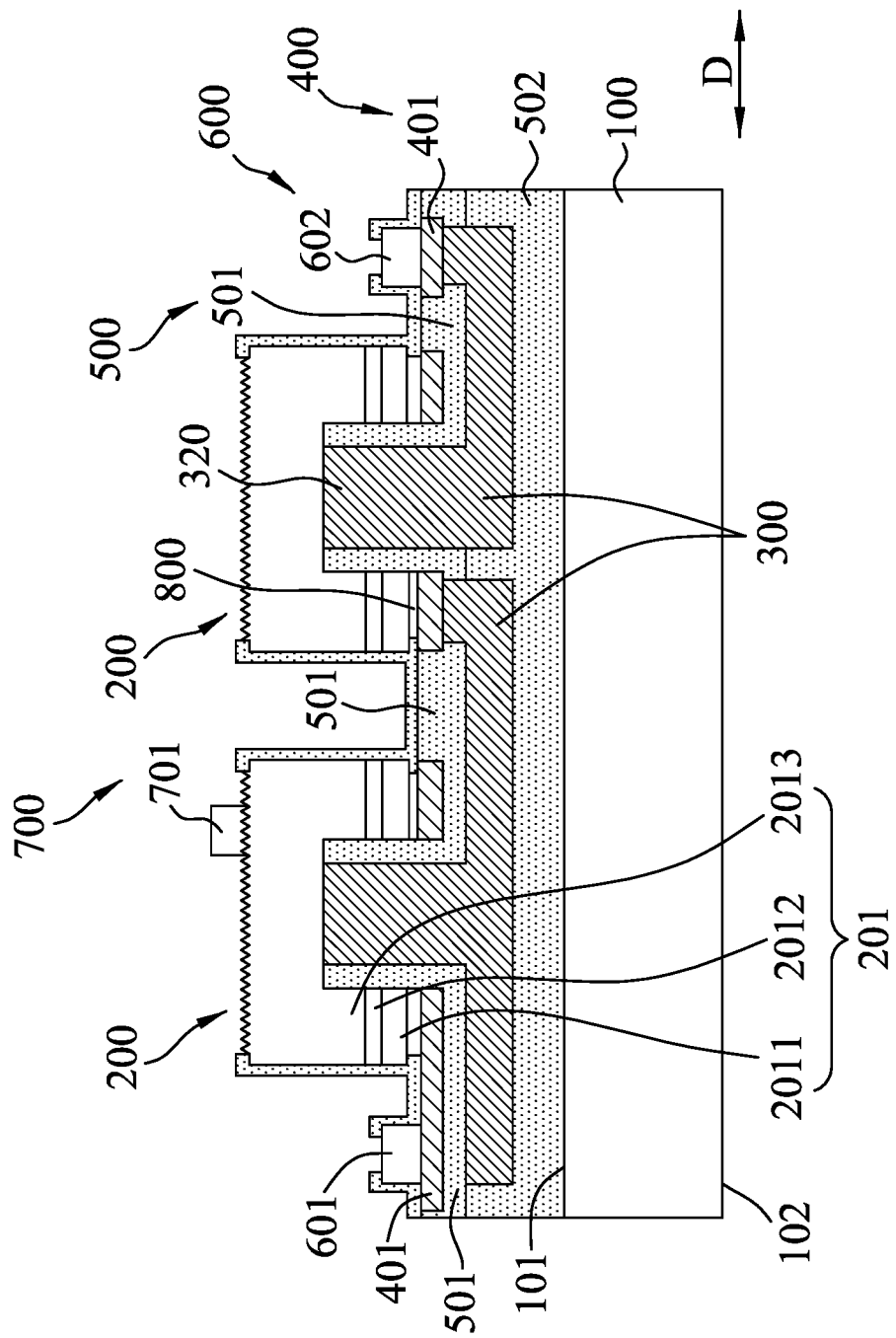
FIG. 1 is a schematic sectional view of a light-emitting device in accordance with some embodiments of this disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
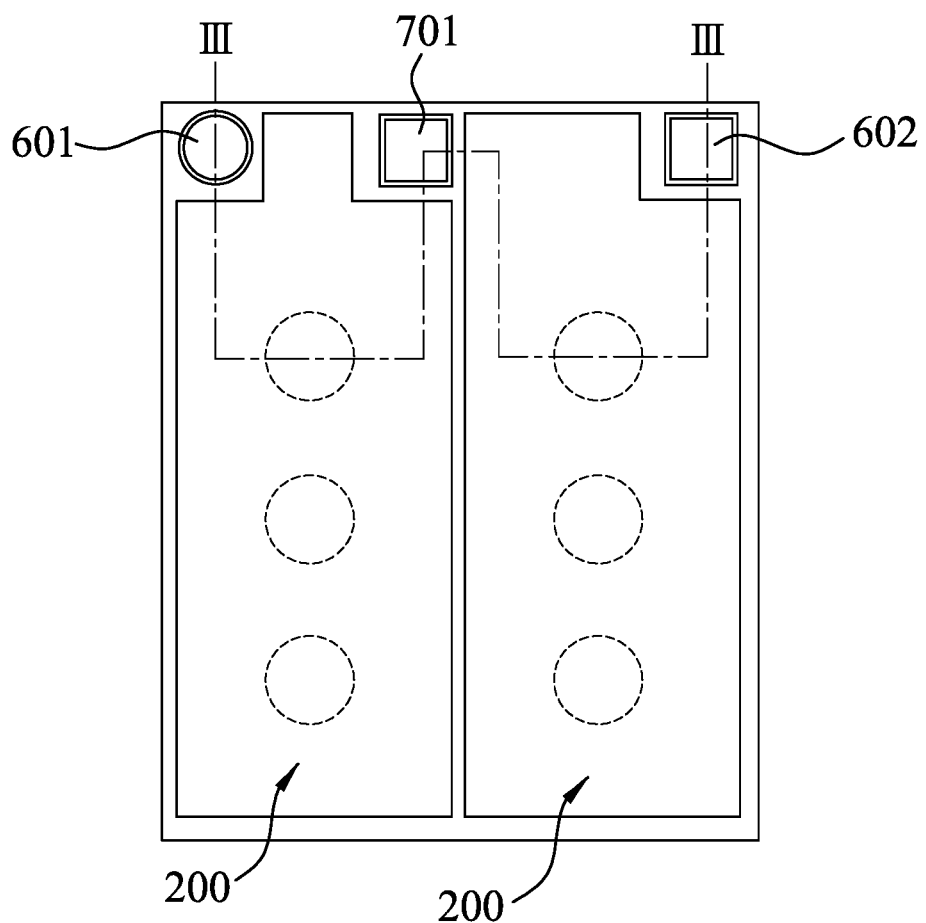
FIG. 2 is a schematic top view of a light-emitting device in accordance with some embodiments of this disclosure.
Figure 3:
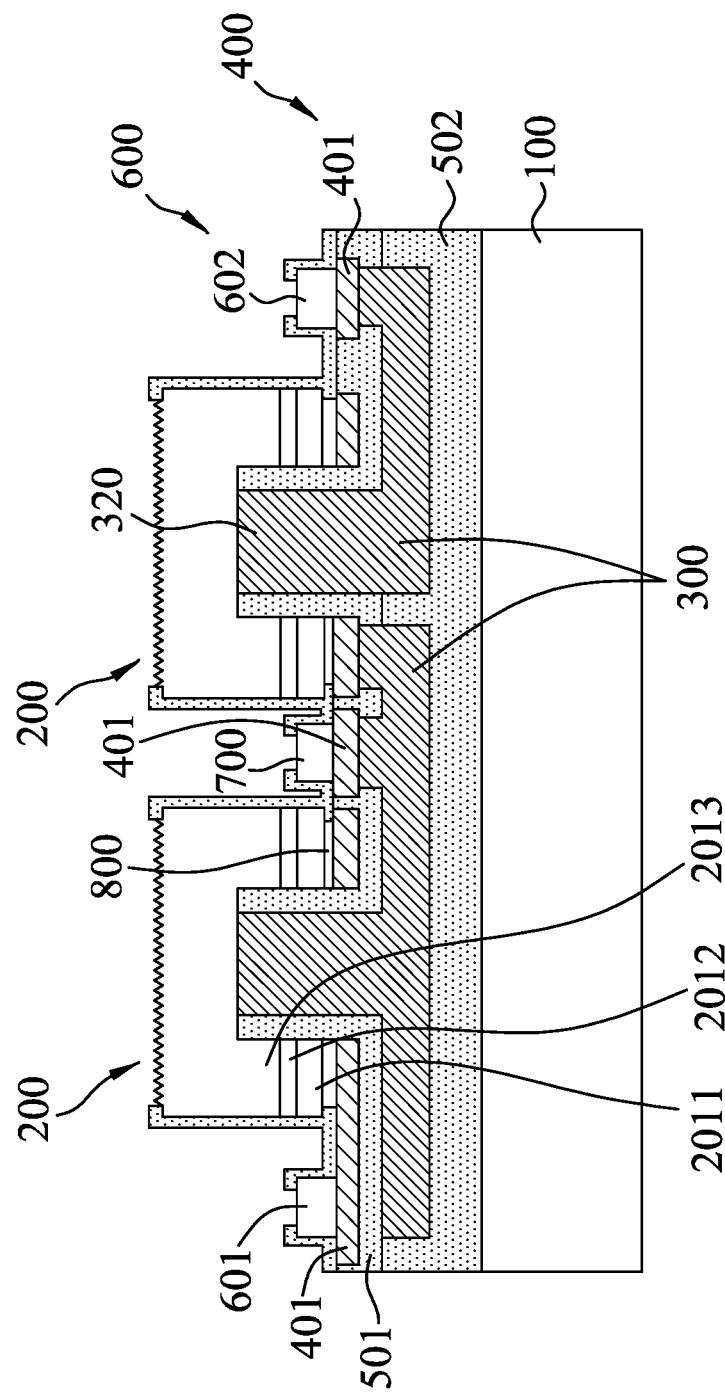
FIG. 3 is a schematic section view of the light-emitting device taken from line III-III of FIG. 2.

Referring to FIGS. 1 to 3, a light-emitting device in accordance with some embodiments of this disclosure includes a substrate (e.g., a permanent substrate 100), a number (N) of light-emitting units 200, a interconnect structure 300, a first electrode 601, a second electrode 602 and an auxiliary electrode structure 700. The permanent substrate 100 has a first surface 101 and a second surface 102 opposite to the first surface 101. The light-emitting units 200 are disposed on the first surface 101 of the permanent substrate 100, are spaced apart from each other, and are interconnected in series by the interconnect structure 300. N is not smaller than 2. Each of the light-emitting units 200 has a light-emitting stack 201 that has a first semiconductor layer 2011, an active layer 2012, and a second semiconductor layer 2013 which has a doping type opposite to that of the first semiconductor layer 2011. In some embodiments, the first semiconductor layer 2011 of each of the light-emitting units 200 is a p-type semiconductor layer, and the second semiconductor layer 2013 of each of the light-emitting units 200 is an n-type semiconductor layer. In some embodiments, the interconnect structure 300 is located underneath the light-emitting units 200, and includes a plurality of extension portions 320, each of which penetrates the first semiconductor layer 2011 and the active layer 2012 of a corresponding one of the light-emitting units 200 and is electrically connected to the second semiconductor layer 2013 of the corresponding light-emitting unit 200. Each of the light-emitting units 200 may be electrically connected to one of the extension portions 320 or a plurality of the extension portions 320. In some embodiments, the interconnect structure 300 can be made of metal. In some embodiments, the light-emitting device further includes an ohmic contact structure 400 located above the interconnect structure 300. The ohmic contact structure 400 includes a plurality of ohmic contact units 401 that are spaced apart from each other. The ohmic contact structure 400 may be made of a suitable electrically conductive material, such as Cr, Ni, Au, Al, or any combination thereof. In some embodiments, the light-emitting device further includes a light-transmissible conductive layer 800 disposed between the first semiconductor layers 2011 of the light-emitting units 200 and the ohmic contact structure 400 for horizontally spreading current (i.e., for spreading the current along a direction (D) that extends parallel to the first surface 101 of the permanent substrate 100). In some embodiments, the light-emitting device further includes an insulating layer 500 (e.g., an electrically insulating layer) disposed on the permanent substrate 100. In some embodiments, the insulating layer 500 includes a plurality of first insulating portions 501 that are disposed between the interconnect structure 300 and the ohmic contact structure 400, and a second insulating portion 502 that is disposed between the interconnect structure 300 and the permanent substrate 100 and that may have a thickness ranging from 50 nm to 500 nm. The insulating layer 500 may improve heat dissipation of the light-emitting device. In some embodiments, the insulating layer 500 may be made of $SiO_2$, $Si_3N_4$, $TiO_2$, $Ti_2O_3$, $Ti_3O_5$, $Ta_2O_5$, $ZrO_2$, or any combination thereof.

In some embodiments, the first electrode 601 may be electrically connected to the first semiconductor layer 2011 of a first one of the light-emitting units 200, for example, through one of the ohmic contact units 401 of the ohmic contact structure 400. In some embodiments, the second electrode 602 may be electrically connected to the second semiconductor layer 2013 of an $N^{th}$ one of the light-emitting units 200, for example, through another one of the ohmic contact units 401 and the interconnect structure 300. In some embodiments, the first and second electrodes 601, 602 may be made of Al, Ni, Ti, Pt, Au, or any combination thereof, and may be made by electron beam evaporation, ion beam sputtering, or other suitable techniques.

The auxiliary electrode structure 700 may be located at a side of the light-emitting units 200, located among the light-emitting units 200, or maybe disposed on the light-emitting units 200. The auxiliary electrode structure 700 may be electrically connected to the interconnect structure 300, and may be electrically connected to the light-emitting stack 201 of at least one of the light-emitting units 200 through the interconnect structure 300. In some embodiments, the auxiliary electrode structure 700 includes at least a number (N−1) of auxiliary electrodes 701. An $i^{th}$ one of the auxiliary electrodes 701 is electrically connected to the light-emitting stack 201 of an $i^{th}$ one of the light-emitting units 200 and to the light-emitting stack 201 of an $(i+1)^{th}$ one of the light-emitting units 200, where i is a variable that takes on an integer value ranging from 1 to (N−1). In some embodiments, the auxiliary electrode structure 700 may be made of Al, Ni, Ti, Pt, Au, or any combination thereof, and may be made by electron beam evaporation, ion beam sputtering, or other suitable techniques.

In some embodiments where N is not smaller than 3, the number (N−1) of auxiliary electrodes 701 are respectively disposed on the second semiconductor layers 2013 of the first to (N−1)$^{th}$ ones of the light-emitting units 200. When the first one of the light-emitting units 200 is to be tested, a testing apparatus (not shown) is connected to the first electrode 601 and the auxiliary electrode 701 on the first one of the light-emitting units 200. When an $N^{th}$ one of the light-emitting units 200 is to be tested, the testing apparatus is connected to the second electrode 602 and the auxiliary electrode 701 on the (N−1)$^{th}$ one of the light-emitting units 200. When the (N−1)$^{th}$ one of the light-emitting units 200 is to be tested, the testing apparatus is connected to the auxiliary electrode 701 on the (N−2)$^{th}$ one of the light-emitting units 200 and the auxiliary electrode 701 on the (N−1)$^{th}$ one of the light-emitting units 200.

Figure 4:
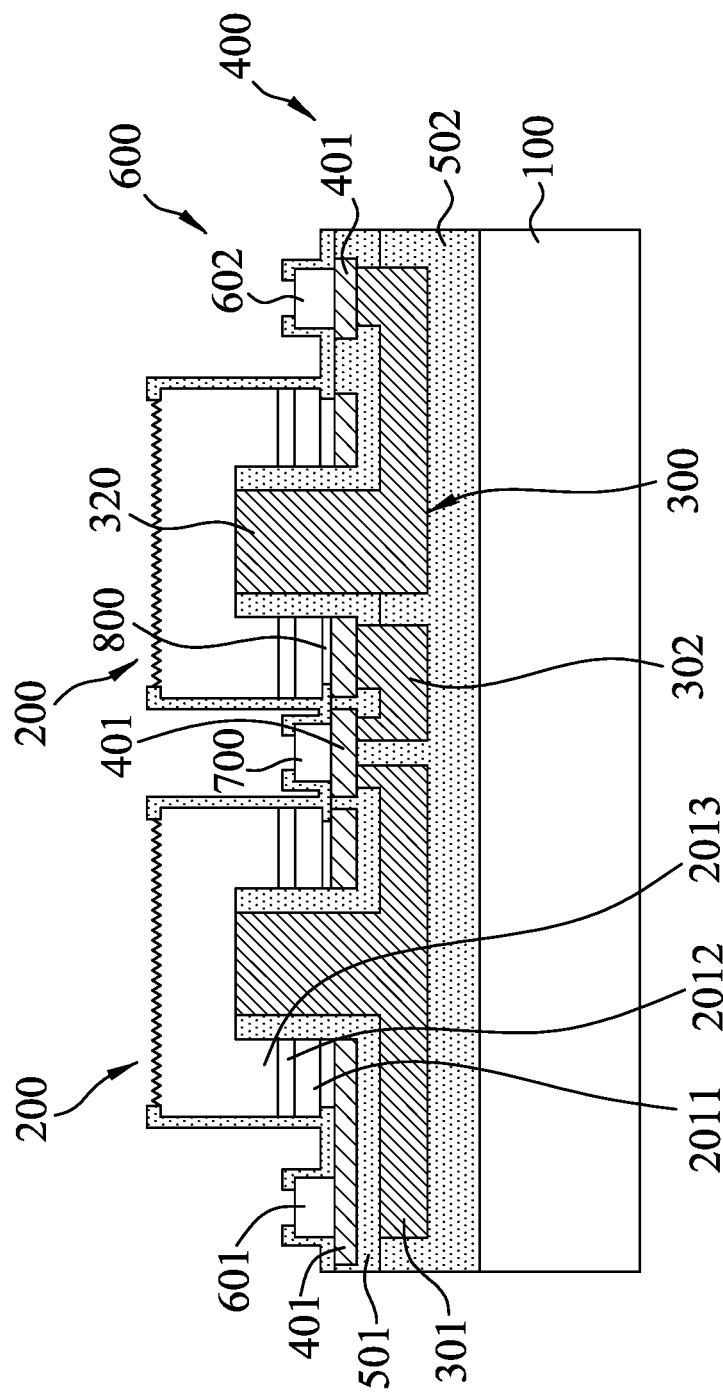
FIG. 4 is a variation of the light-emitting device in FIG. 3.

Referring to FIGS. 2 and 3, in some embodiments, the auxiliary electrode structure 700 is disposed between two light-emitting units 200, and is connected to the light-emitting stacks 201 of the light-emitting units 200 through the interconnect structure 300. In some embodiments, one of the ohmic contact units 401 is connected between the auxiliary electrode structure 700 and the interconnect structure 300. Referring to FIG. 4, in some embodiments, the interconnect structure 300 includes a first connecting portion 301 and a second connecting portion 302 that are spaced apart from each other, and that are electrically connected to the auxiliary electrode structure 700 through one of the ohmic contact units 401. The structure of FIG. 4 may be applied to the light-emitting device that includes the number (N) of light-emitting units 200, where the auxiliary electrode structure 700 includes the number (N−1) of auxiliary electrodes 701 with the first one of the auxiliary electrodes 701 disposed between the first and second ones of the light-emitting units 200, the second one of the auxiliary electrodes 701 disposed between the second and third ones of the light-emitting units 200, and so on. When the first one of the light-emitting units 200 is to be tested, the testing apparatus is connected to the first electrode 601 and the auxiliary electrode 701 located between the first and second ones of the light-emitting units 200. When the $N^{th}$ one of the light-emitting units 200 is to be tested, the testing apparatus is connected to the second electrode 602 and the auxiliary electrode 701 located between the $N^{th}$ and the (N−1)$^{th}$ ones of the light-emitting units 200. When the (N−1)$^{th}$ one of the light-emitting units 200 is to be tested, the testing apparatus is connected to the auxiliary electrode 701 located between the (N−2)$^{th}$ and the (N−1)$^{th}$ ones of the light-emitting units 200 and the auxiliary electrode 701 located between the (N−1)$^{th}$ and the $N^{th}$ ones of the light-emitting units 200.

Referring to FIGS. 5 to 10, in some embodiments, the light-emitting device includes the number (N) of light-emitting units 200, the first and second electrodes 601, 602, the number (N−1) of auxiliary electrodes 701, multiple ohmic contact units 401, and the interconnect structure 300.

Figure 5:
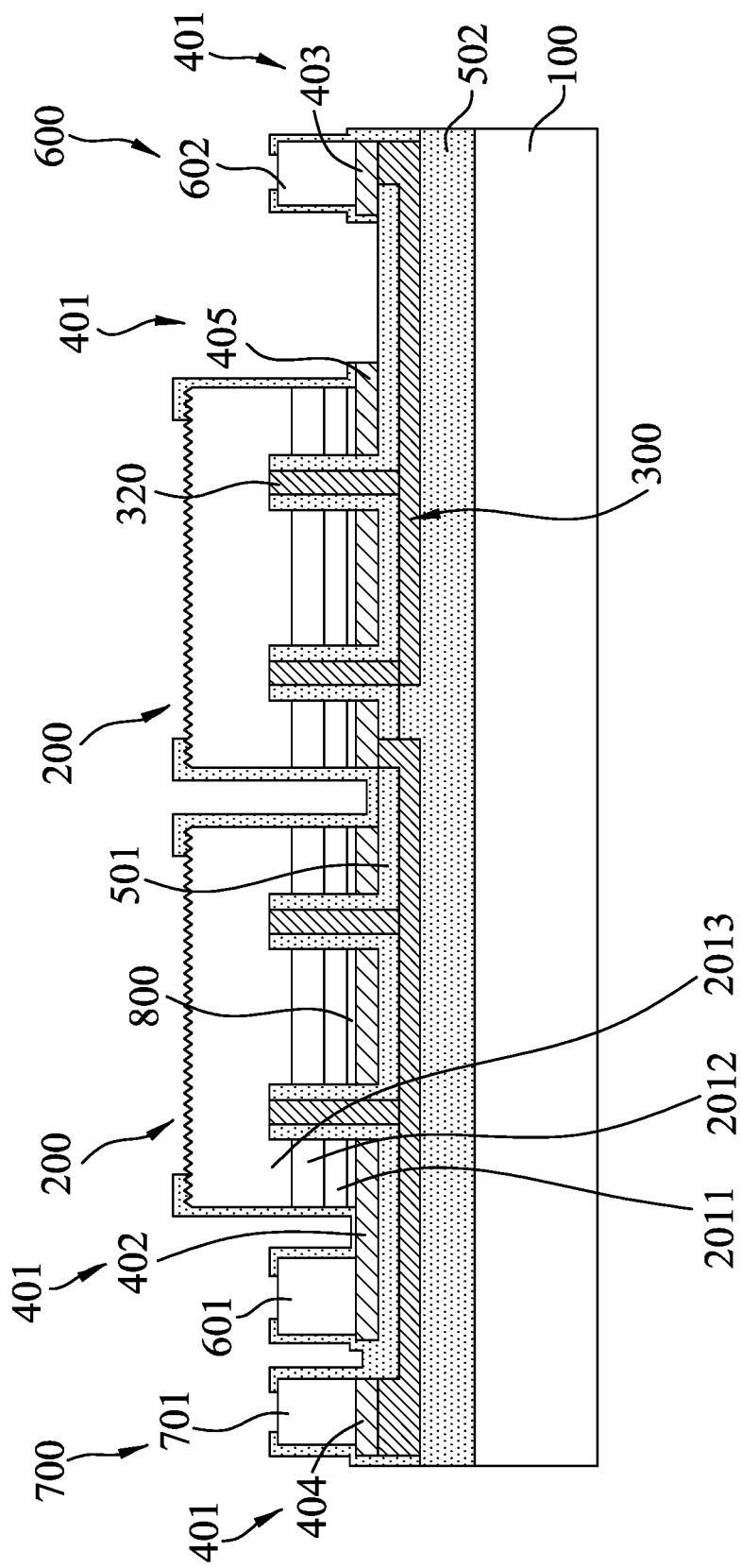
FIG. 5 is a schematic top view of a light-emitting device in accordance with some embodiments of this disclosure.

Referring to FIG. 5, when N equals 2, there are two light-emitting units 200, one auxiliary electrode 701, and four ohmic contact units 401 (i.e., the ohmic contact units 402, 403, 404, 405 shown in FIG. 5). The first electrode 601 may be disposed at a side of the first one of the light-emitting units 200, and is electrically connected to the first semiconductor layer 2011 of the first one of the light-emitting units 200 through the ohmic contact unit 402. The auxiliary electrode 701 may be disposed at a side of the first electrode 601 opposite to the first one of the light-emitting units 200, and may be electrically connected to the second semiconductor layer 2013 of the first one of the light-emitting units 200 through the ohmic contact unit 404 and the interconnect structure 300. The auxiliary electrode 701 may be further electrically connected to the first semiconductor layer 2011 of the second one of the light-emitting units 200 through the ohmic contact unit 404, the interconnect structure 300 and the ohmic contact unit 405. The second electrode 602 may be located at a side of the second one of the light-emitting units 200, and may be electrically connected to the second semiconductor layer 2013 of the second one of the light-emitting units 200 through the ohmic contact unit 403 and the interconnect structure 300. When the first one of the light-emitting units 200 is to be tested, the testing apparatus is connected to the first electrode 601 and the auxiliary electrode 701. When the second one of the light-emitting units 200 is to be tested, the testing apparatus is connected to the auxiliary electrode 701 and the second electrode 602.

Figure 6:
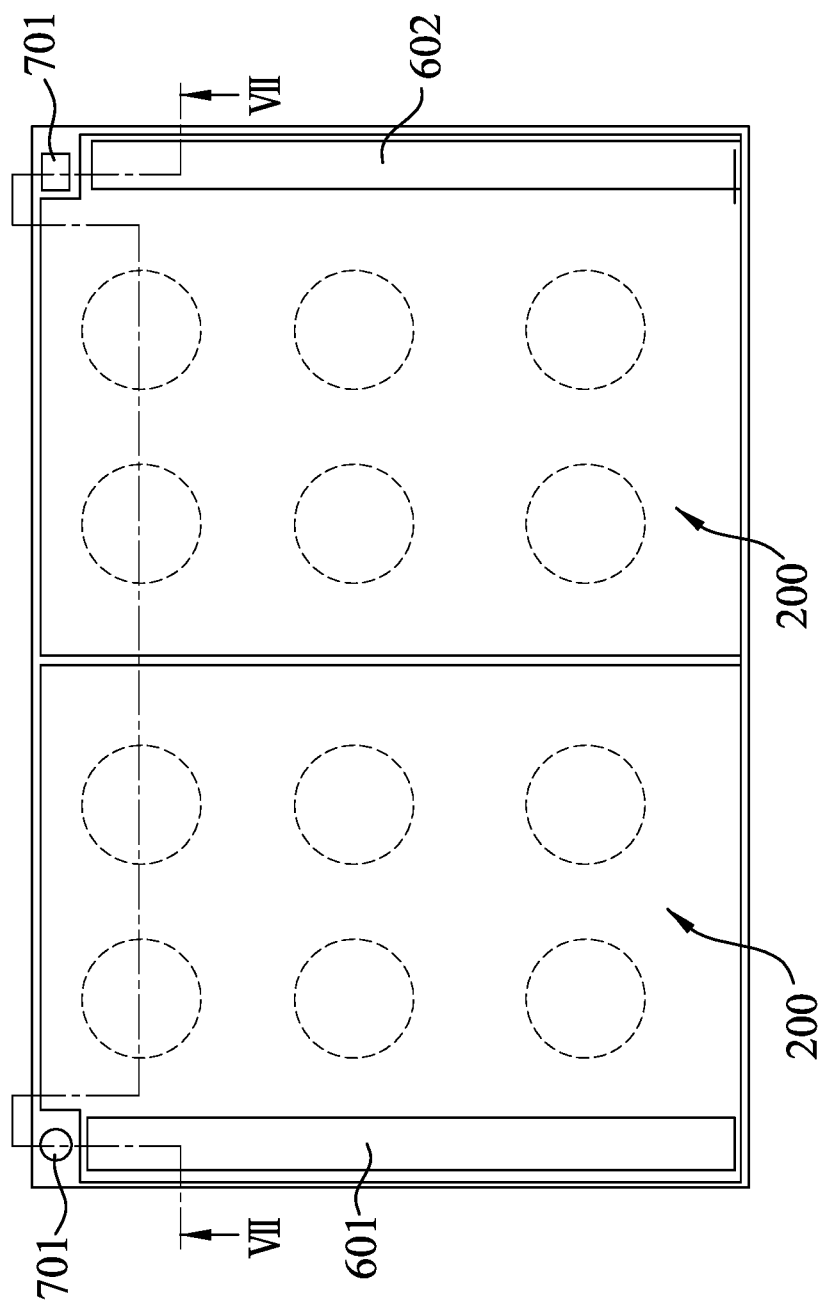
FIG. 6 is a schematic top view of a light-emitting device in accordance with some embodiments of this disclosure.
Figure 7:
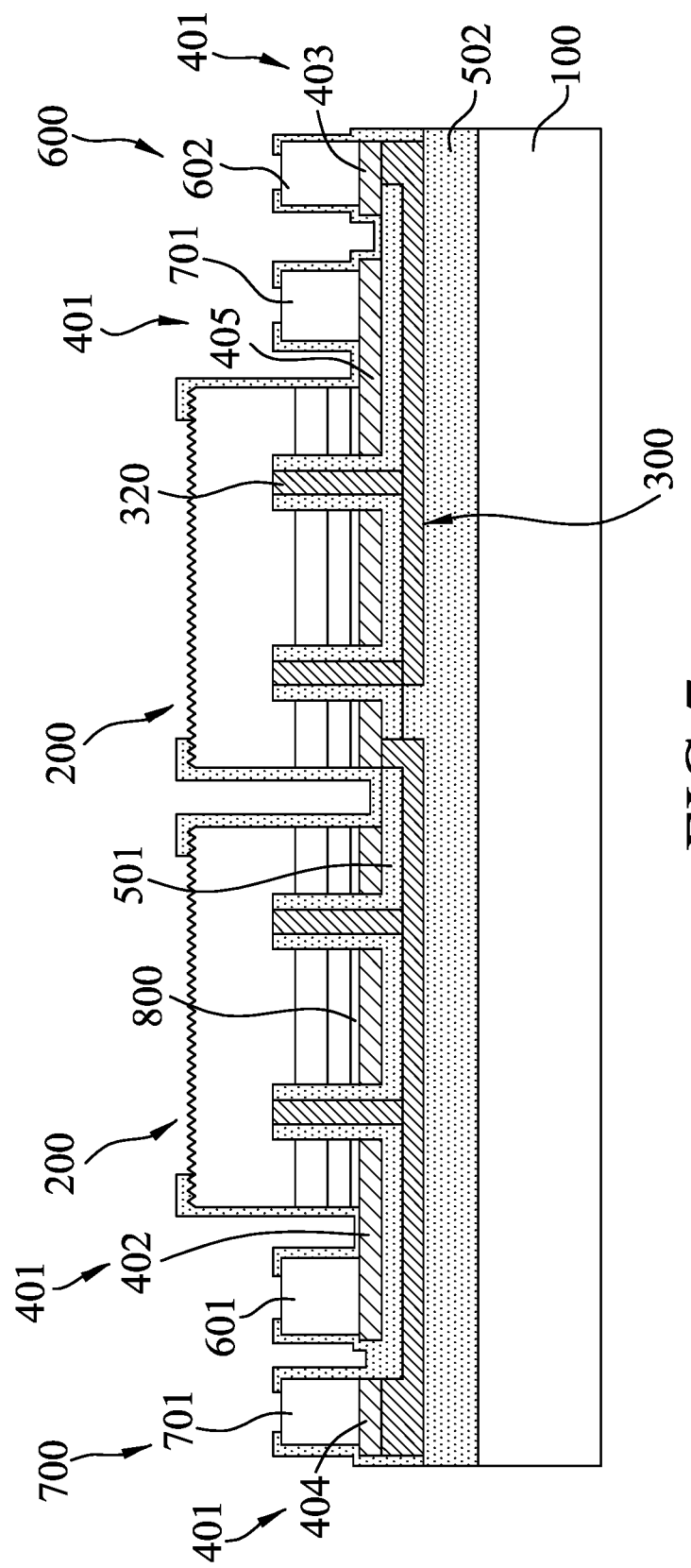
FIG. 7 is a schematic section view of the light-emitting device taken from line VII-VII of FIG. 6.

Referring to FIGS. 6 and 7, in a variation of FIG. 5, the light-emitting device further includes another auxiliary electrode 701 that is located between the second one of the light-emitting units 200 and the second electrode 602, and that is electrically connected to the first semiconductor layer 2011 of the second one of the light-emitting units 200 through the ohmic contact unit 405. The second one of the light-emitting units 200 may be tested by connecting the testing apparatus to the another auxiliary electrode 701 and the second electrode 602.

Figure 8:
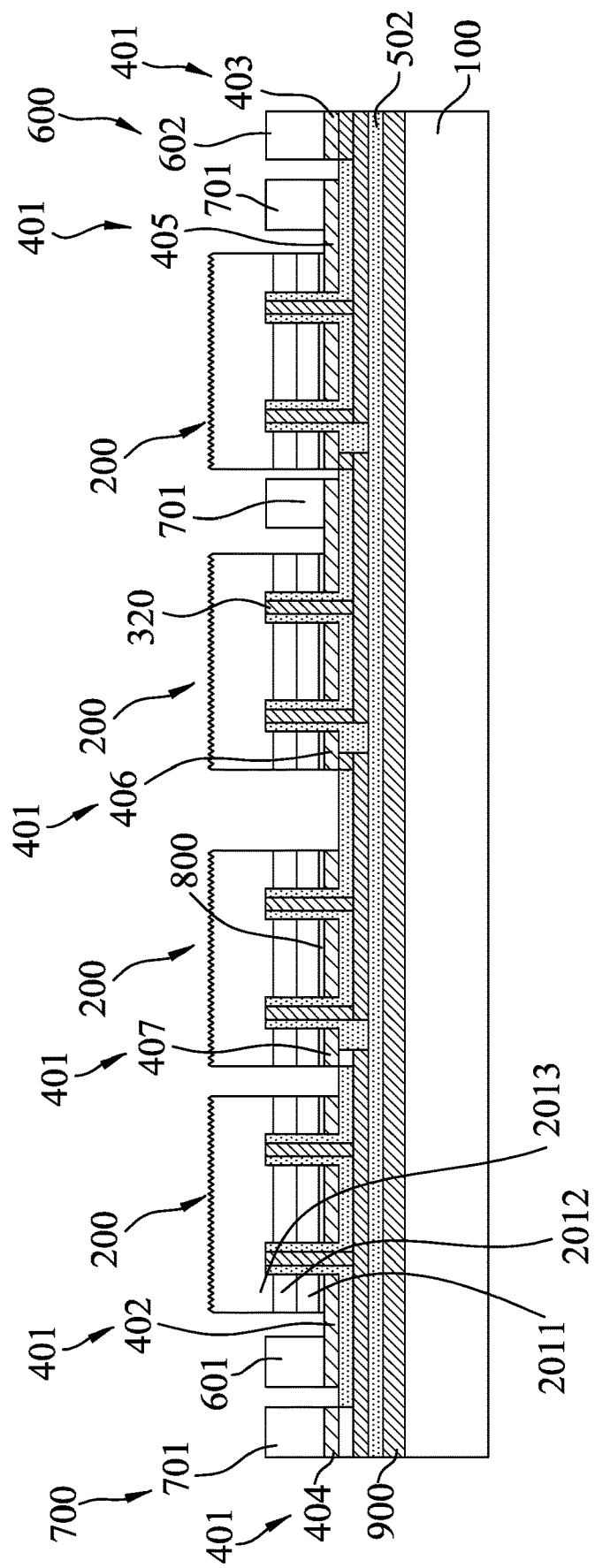
FIG. 8 is a schematic top view of a light-emitting device in accordance with some embodiments of this disclosure.

Referring to FIG. 8, when N equals 4, there are four light-emitting units 200, three auxiliary electrodes 701, and five ohmic contact units 401 (i.e., the ohmic contact units 402, 403, 404, 405, 406, 407). The first electrode 601 may be disposed at a side of the first one of the light-emitting units 200, and is electrically connected to the first semiconductor layer 2011 of the first one of the light-emitting units 200 through the ohmic contact unit 402. A first auxiliary electrode 701 may be disposed at a side of the first electrode 601 opposite to the first one of the light-emitting units 200, and may be electrically connected to the second semiconductor layer 2013 of the first one of the light-emitting units 200 through the ohmic contact unit 404 and the interconnect structure 300. The first auxiliary electrode 701 may be further electrically connected to the first semiconductor layer 2011 of the second one of the light-emitting units 200 through the ohmic contact unit 404, the interconnect structure 300 and the ohmic contact unit 407. A second auxiliary electrode 701 may be disposed at a side of a third one of the light-emitting units 200, and may be electrically connected to the second semiconductor layer 2013 of a second one of the light-emitting units 200 through the ohmic contact unit 406 and the interconnect structure 300 and the first semiconductor layer 2011 of the third one of the light-emitting units 200 through the ohmic contact unit 406. A third auxiliary electrode 701 may be disposed at a side of a fourth one of the light-emitting units 200, and may be electrically connected to the second semiconductor layer 2013 of the third one of the light-emitting units 200 through the ohmic contact unit 405 and the interconnect structure 300, and may be electrically connected to the first semiconductor layer 2011 of the fourth one of the light-emitting units 200 through the ohmic contact unit 405. The second electrode 602 may be disposed at a side of the third auxiliary electrode 701 opposite to the fourth one of the light-emitting units 200, and may be electrically connected to the second semiconductor layer 2013 of the fourth one of the light-emitting units 200 through the ohmic contact unit 403 and the interconnect structure 300. The first one of the light-emitting units 200 can be tested by connecting the testing apparatus to the first auxiliary electrode 701 and the first electrode 601. The second one of the light-emitting units 200 can be tested by connecting the testing apparatus to the first auxiliary electrode 701 and the second auxiliary electrode 701. The third one of the light-emitting units 200 can be tested by connecting the testing apparatus to the second auxiliary electrode 701 and the third auxiliary electrode 701. The fourth one of the light-emitting units 200 can be tested by connecting the testing apparatus to the third auxiliary electrode 701 and the second electrode 602. In some embodiments, the second insulating portion 502 of the insulating layer 500 may be connected to the permanent substrate 100 through a metal bonding layer 900.

Figure 9:
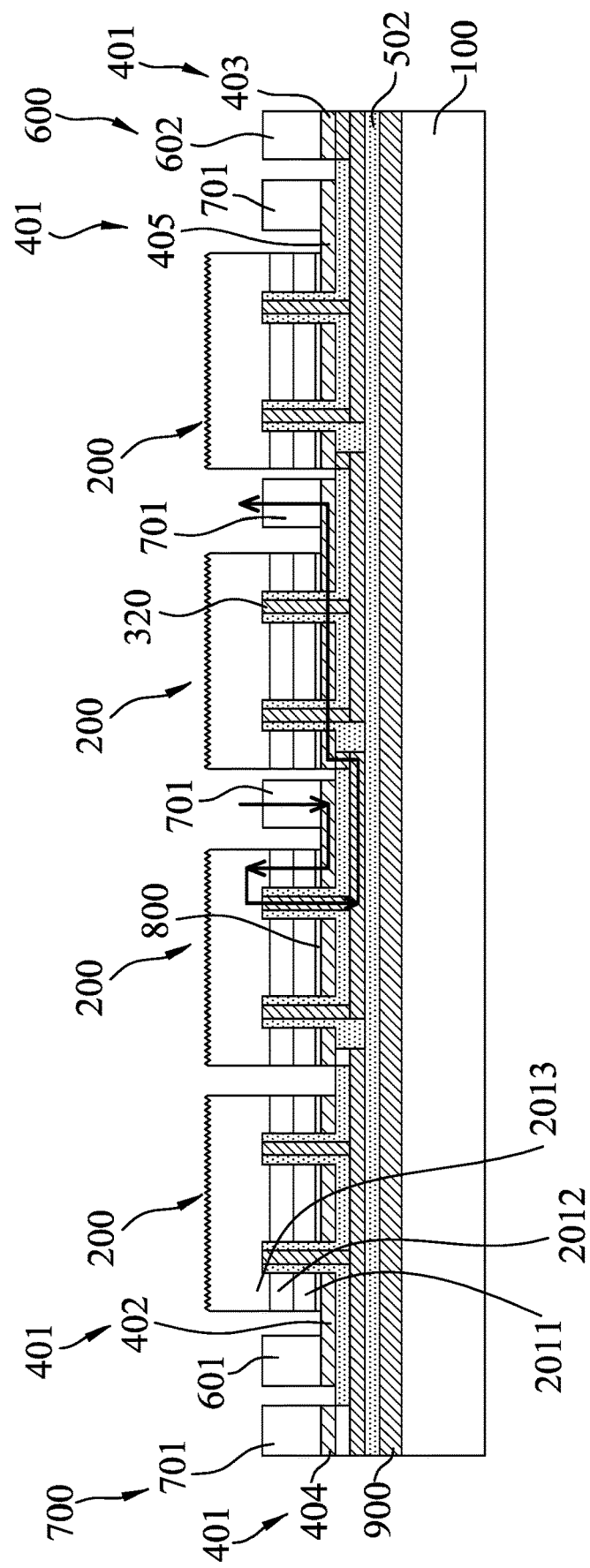
FIG. 9 is a schematic top view of a variation of the light-emitting device of FIG. 8.

Referring to FIG. 9, in a variation of FIG. 8, the light-emitting device may further include a fourth auxiliary electrode 701 that is disposed between the second and third ones of the light-emitting units 200, that is electrically connected to the first semiconductor layer 2011 of the second one of the light-emitting units 200 through the ohmic contact unit 407, and that is electrically connected to the second semiconductor layer 2013 of the first one of the light-emitting units 200 through the ohmic contact unit 407 and the interconnect structure 300. Therefore, as shown by the arrows in FIG. 9, the second one of the light-emitting units 200 may be tested by connecting the testing apparatus to the second and fourth auxiliary electrodes 701.

Figure 10:
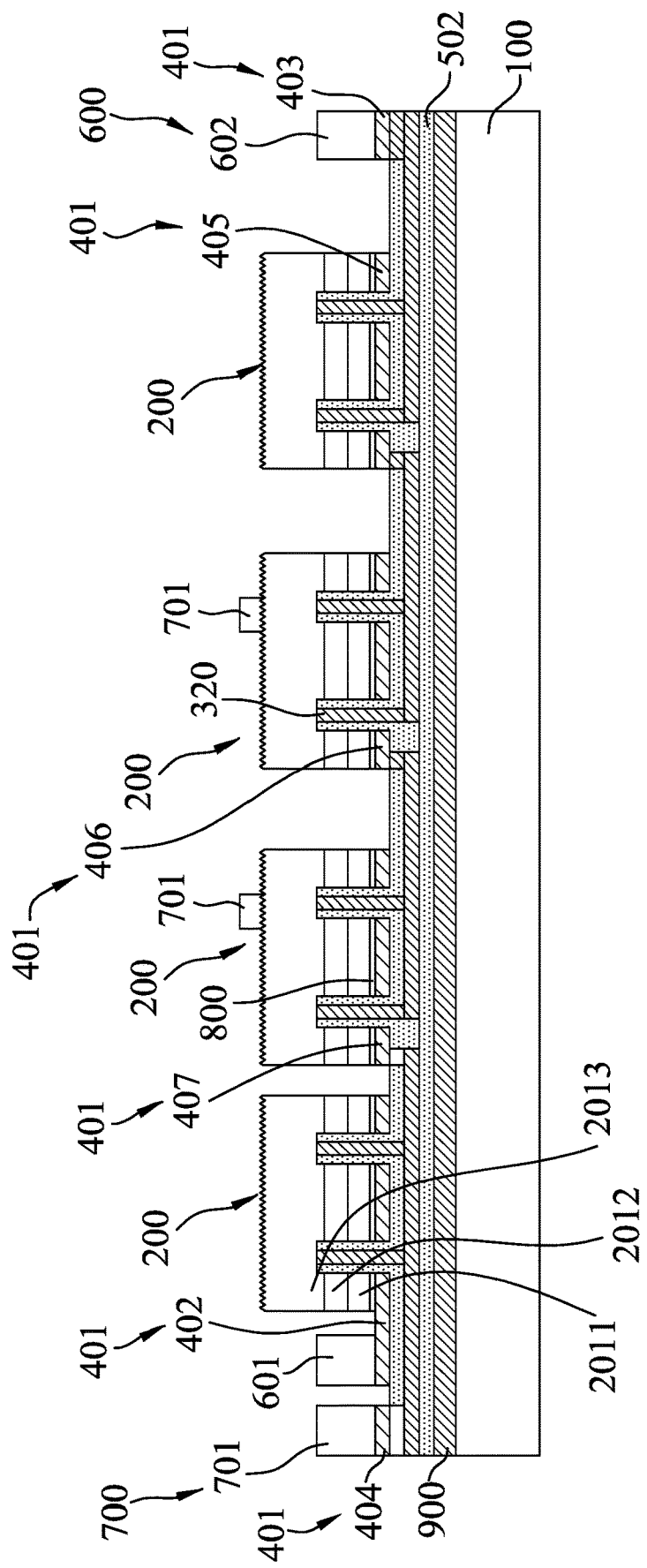
FIG. 10 is a schematic top view of another variation of the light-emitting device of FIG. 8.

Referring to FIG. 10, in another variation of FIG. 8, the second and third auxiliary electrodes 701 may be respectively disposed on and electrically connected to the second semiconductor layers 2013 of the second and third ones of the light-emitting units 200. The first one of the light-emitting units 200 can be tested by connecting the testing apparatus to the first electrode 601 and the first auxiliary electrode 701. The second one of the light-emitting units 200 can be tested by connecting the testing apparatus to the first auxiliary electrode 701 and the second auxiliary electrode 701 on the second one of the light-emitting units 200. The third one of the light-emitting units 200 can be tested by connecting the testing apparatus to the second auxiliary electrode 701 on the second one of the light-emitting units 200 and the third auxiliary electrode 701 on the third one of the light-emitting units 200. The fourth one of the light-emitting units 200 can be tested by connecting the testing apparatus to the third auxiliary electrode 701 on the third one of the light-emitting units 200 and the second electrode 602.

Figure 11:
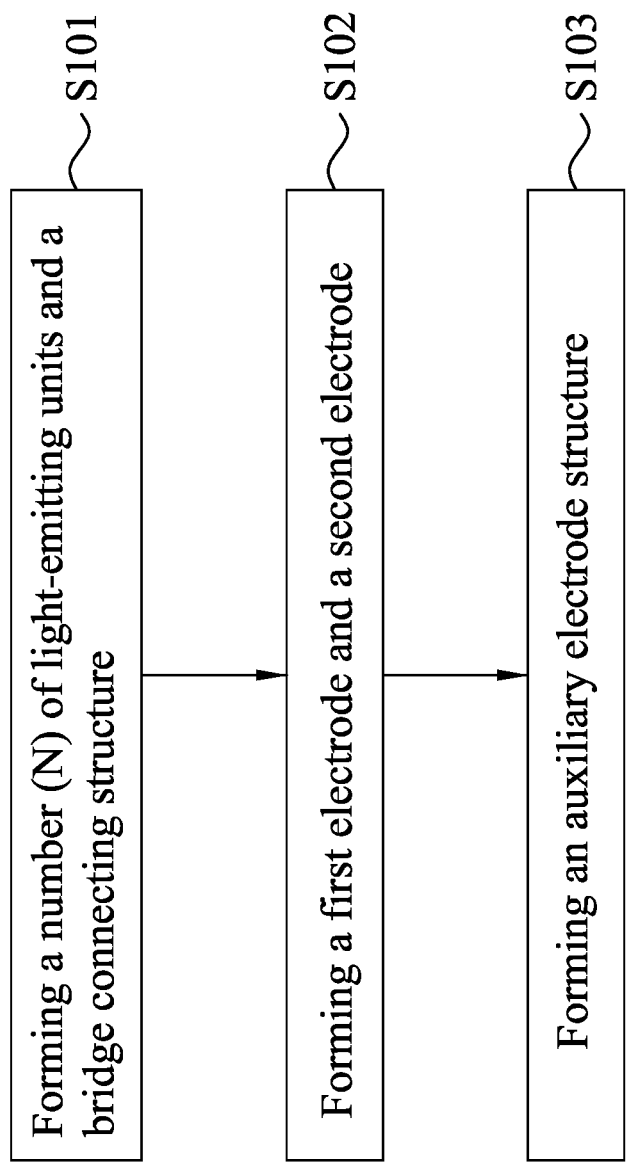
FIG. 11 is a flow chart of a method for making a light-emitting device in accordance with some embodiments of this disclosure.

FIG. 11 is a flow chart describing a method of making the light-emitting device in accordance with some embodiments of this disclosure. The method includes steps S101 to S103.

Figure 12:
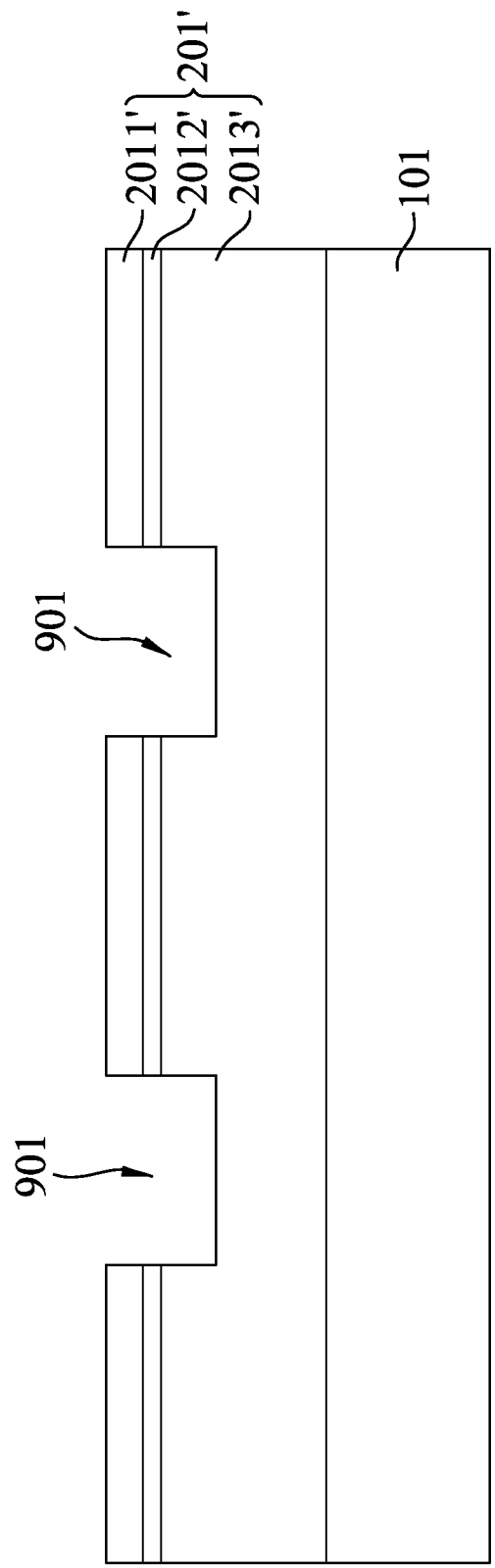
FIGS. 12 to 22 are schematic sectional views of steps of the method of making the light-emitting device.

In step S101, the number (N) of the light-emitting units 200 (see FIG. 19) and the interconnect structure 300 (see FIG. 19) are formed. The number (N) is not smaller than two. The light-emitting units 200 are connected in series by the interconnect structure 300. Specifically, referring to FIG. 12, a temporary substrate 101 is first provided. The temporary substrate 101 may be made of sapphire, silicon carbide, germanium nitride, or other suitable materials. Then, a second semiconductor film 2013', an active film 2012' and a first semiconductor film 2011' are sequentially formed on the temporary substrate 101 by metal-organic chemical vapor deposition (MOCVD) or other suitable techniques, and are collectively referred to as an epitaxial layer 201'. Then, a plurality of holes 901 are formed in the epitaxial layer 201' until the second semiconductor film 2013' are partially etched and exposed from the holes 901. The holes 901 may be formed by dry etching or other suitable techniques.

Figure 13:
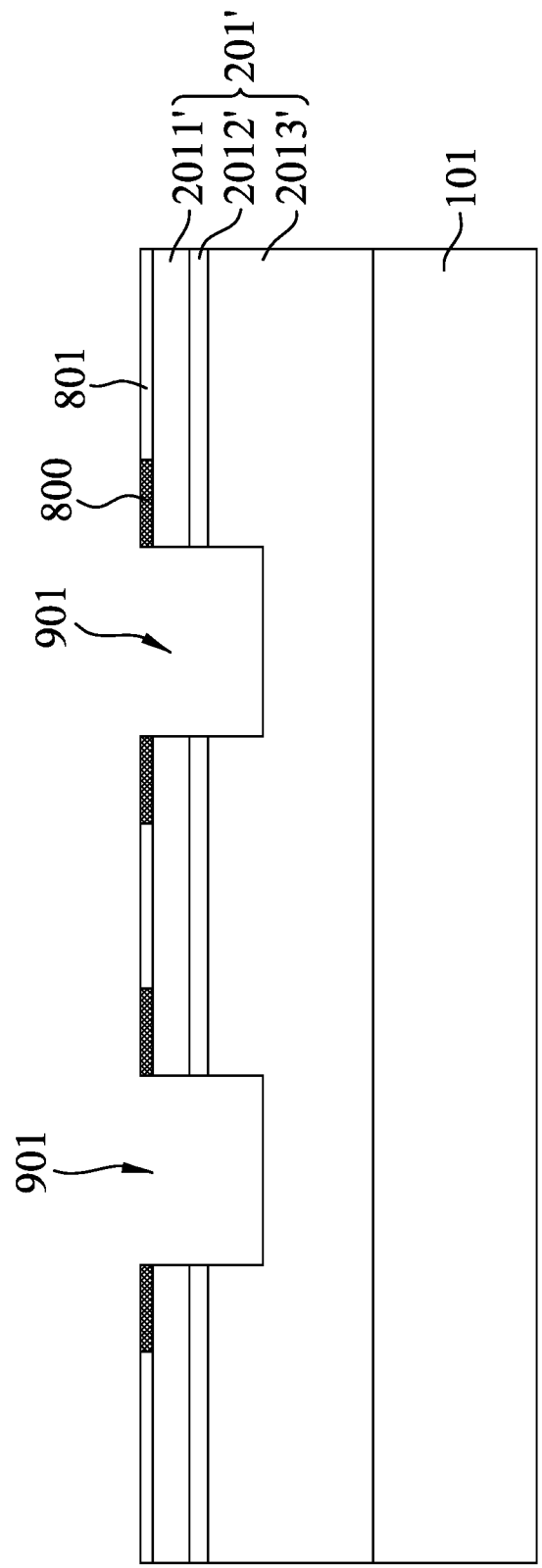

Referring to FIG. 13, then, the light-transmissible conductive layer 800 and a first insulating film 801 (the first insulating film 801 being the first insulating portions 501 of the insulating layer 500 shown in FIGS. 1, 3 to 5 and 7) are formed on the first semiconductor film 2011' of the epitaxial layer 201' and formed outside of the holes 901.

Figure 14:
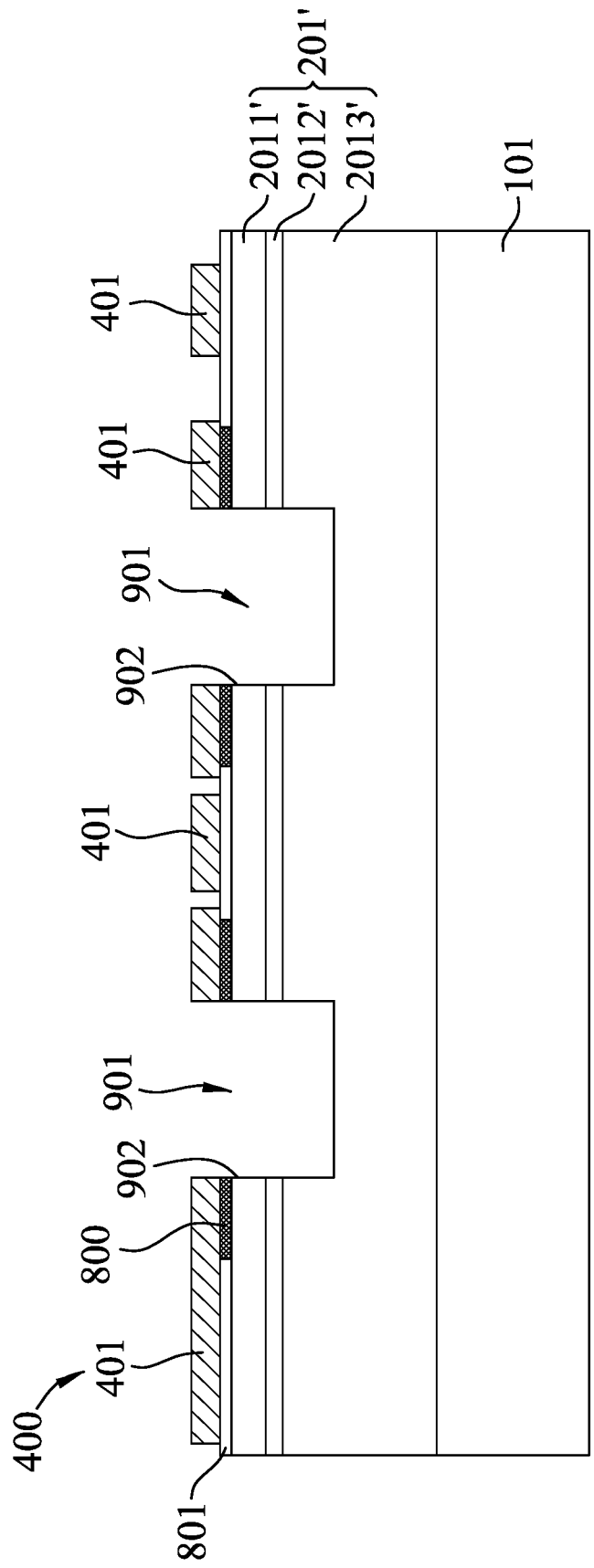

Referring to FIG. 14, then, the ohmic contact structure 400 is formed on the light-transmissible conductive layer 800 and the first insulating film 801, and includes the ohmic contact units 401 that are spaced apart from each other.

Figure 15:
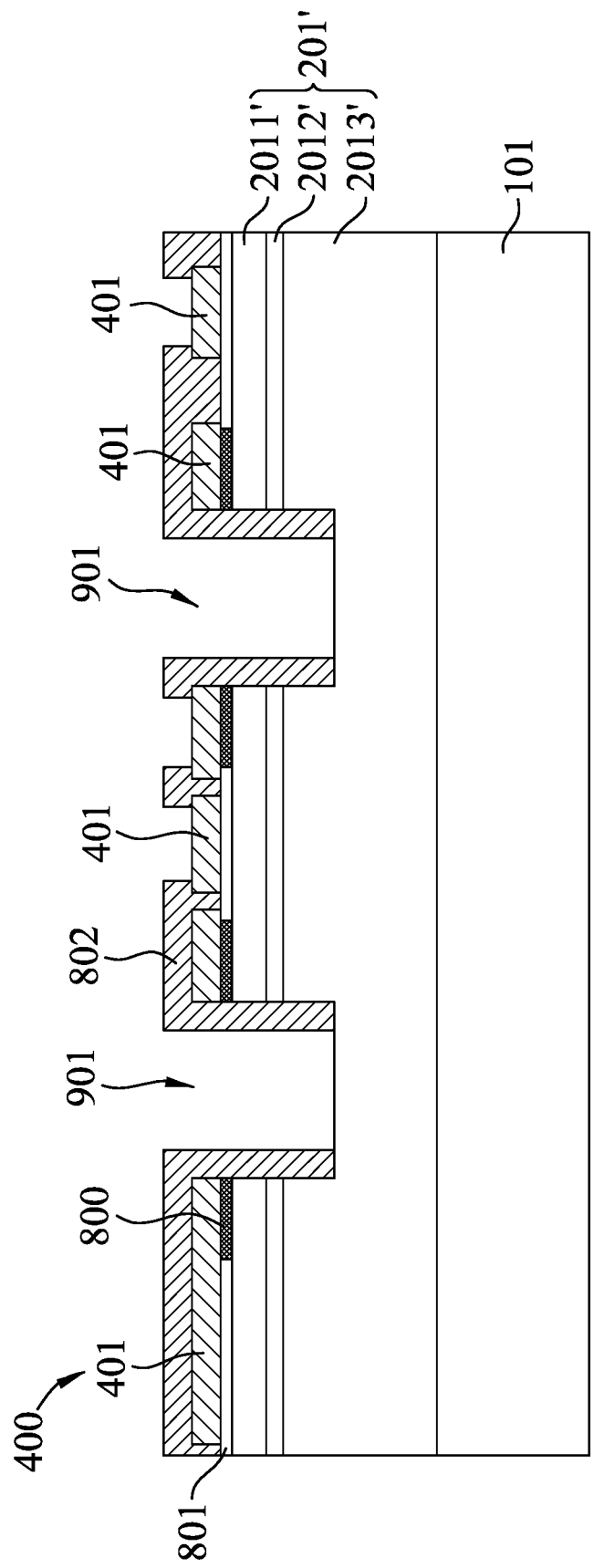

Referring to FIG. 15, then, a second insulating film 802 is formed to cover hole-defining walls 902 (see FIG. 14), which define the holes 901, and partially covers the ohmic contact structure 400.

Figure 16:
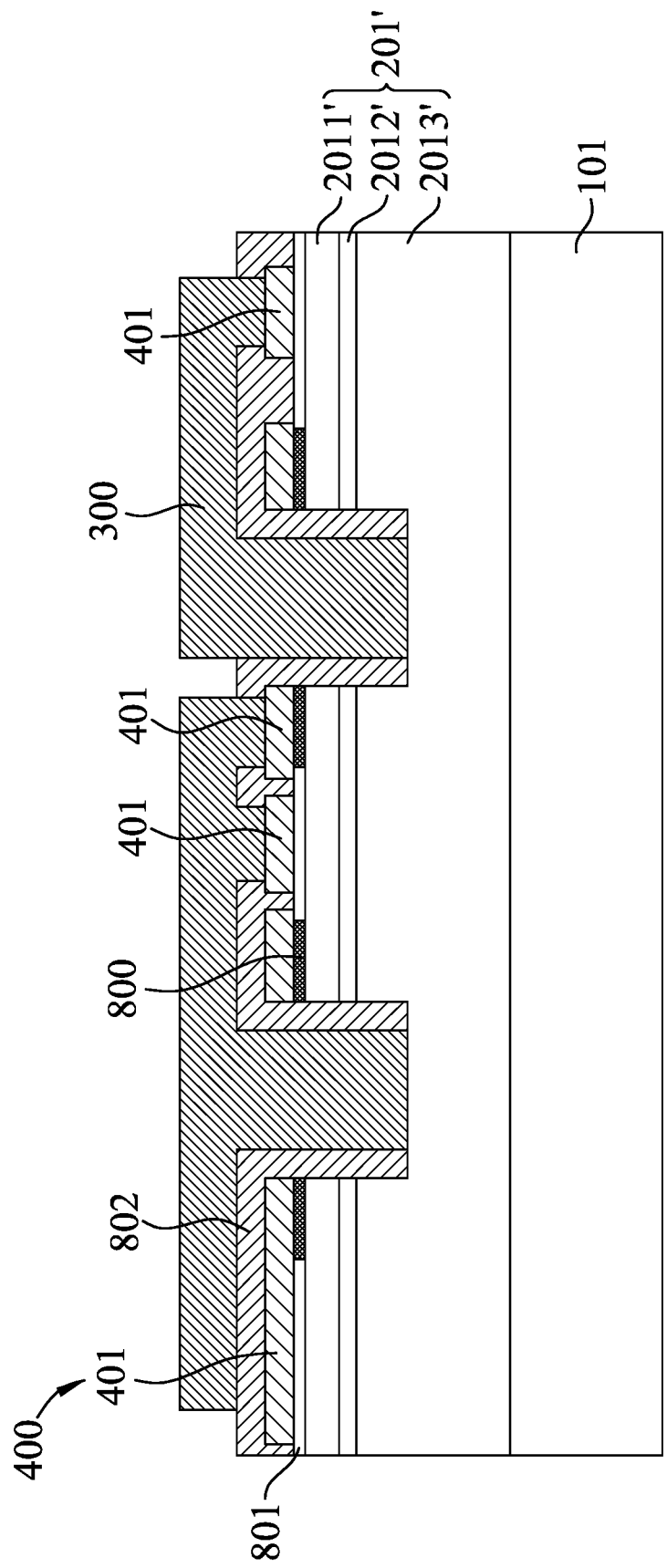

Referring to FIG. 16, then, the interconnect structure 300 is formed to fill the holes 901 (see FIG. 15), is formed on the second insulating film 802, and is electrically connected to corresponding ones of the ohmic contact units 401.

Figure 17:
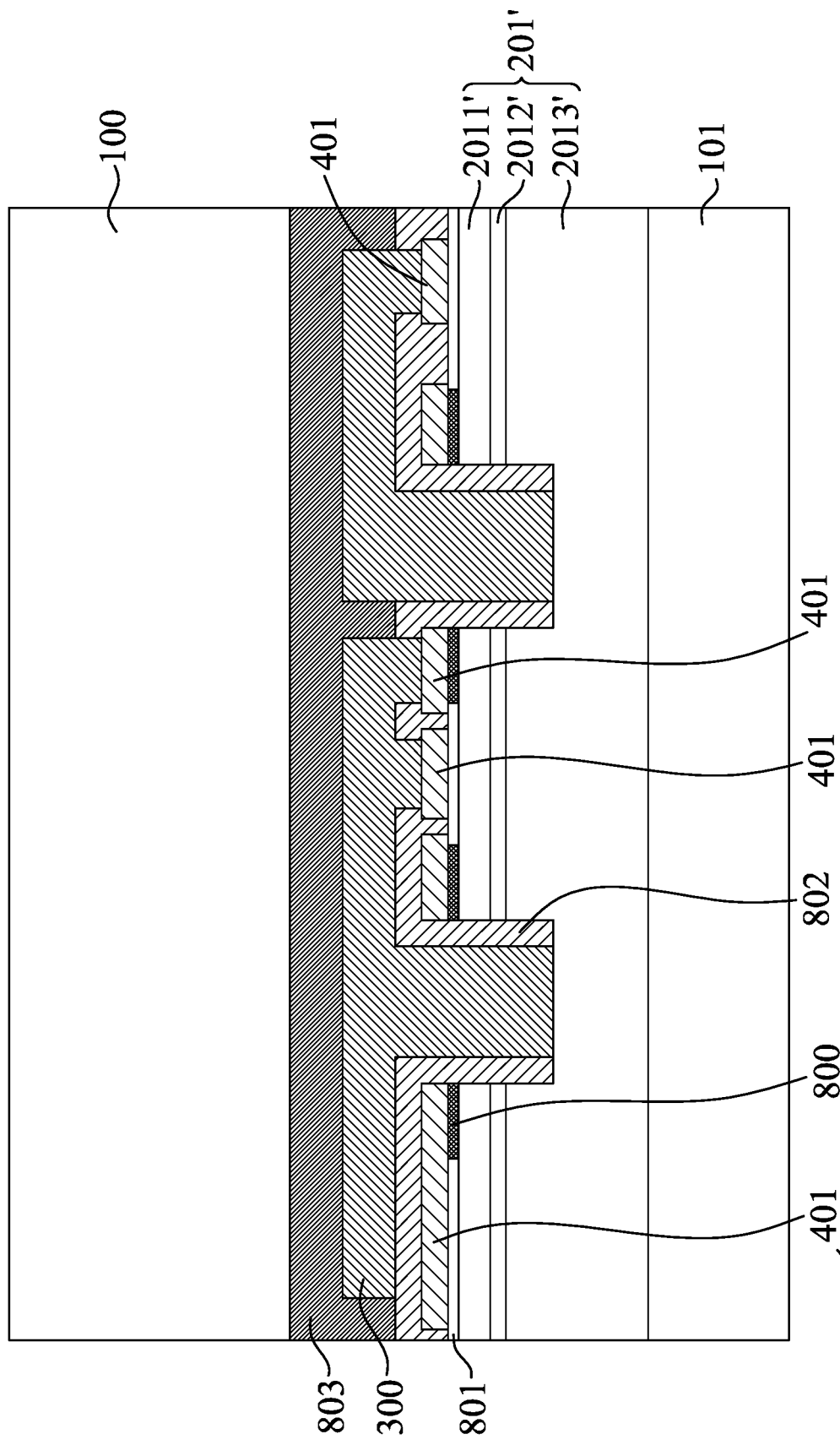

Referring to FIG. 17, then, a third insulating film 803 (the third insulating film 803 being the second insulating portion 502 of the insulating layer 500 shown in FIGS. 1, 3 to 5, and 7 to 10) is formed on the interconnect structure 300, and the permanent substrate 100 is connected to the third insulating film 803. The permanent substrate 100 may be made of ceramics, metals or other suitable materials, and may be connected to the third insulating film 803 by metal bonding, gluing, or other suitable techniques.

Figure 18:
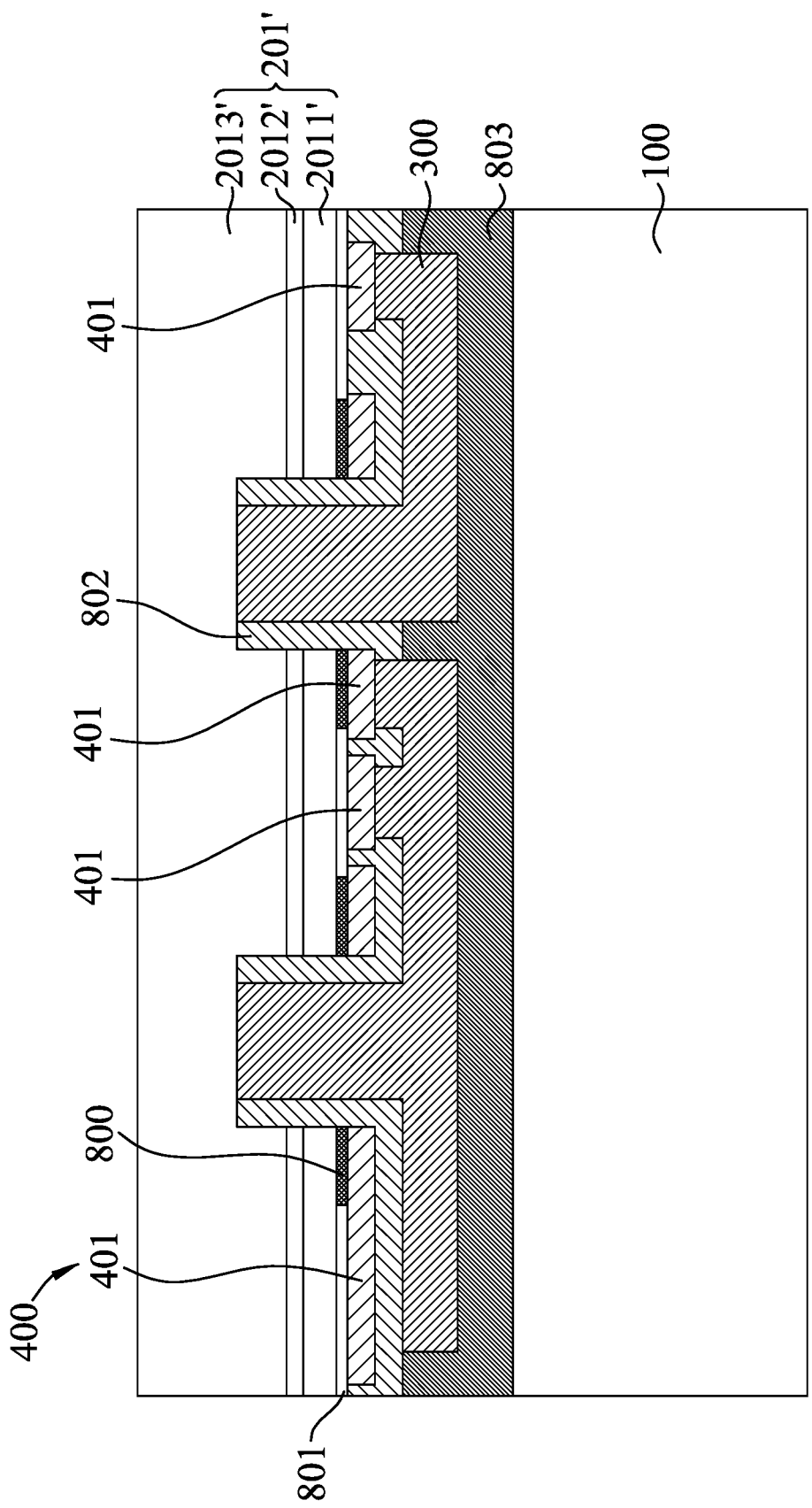

Referring to FIG. 18, then, the temporary substrate 101 is removed from the second semiconductor film 2013' of the epitaxial layer 201' by laser lift off, chemical mechanical polishing (CMP), dry etching, or other suitable techniques.

Figure 19:
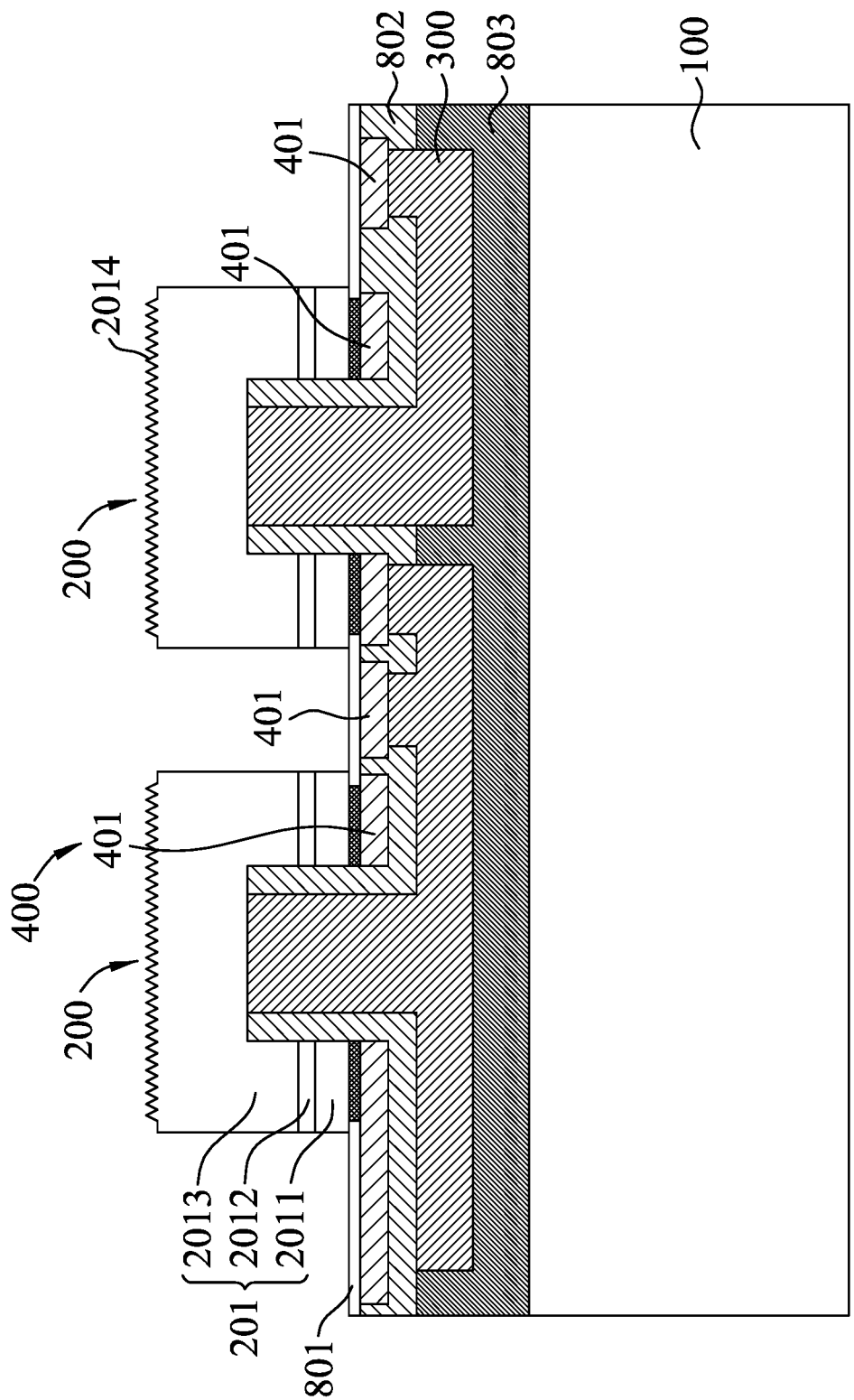

Referring to FIG. 19, then, the epitaxial layer 201' (see FIG. 18) is etched to form a plurality of the light-emitting units 200 each including the light-emitting stack 201 which includes the first semiconductor layer 2011, the active layer 2012 and the second semiconductor layer 2013. In some embodiments, an upper surface 2014 of each of the light-emitting units 200 may be roughened by wet etching, dry etching or other suitable techniques for increasing the light emitting efficiency of the light-emitting units 200.

Afterwards, the method of FIG. 11 proceeds to steps S102 and S103, where the first electrode 601, the second electrode 602 and the auxiliary electrode structure 700 (see FIG. 21) are formed.

Figure 20:
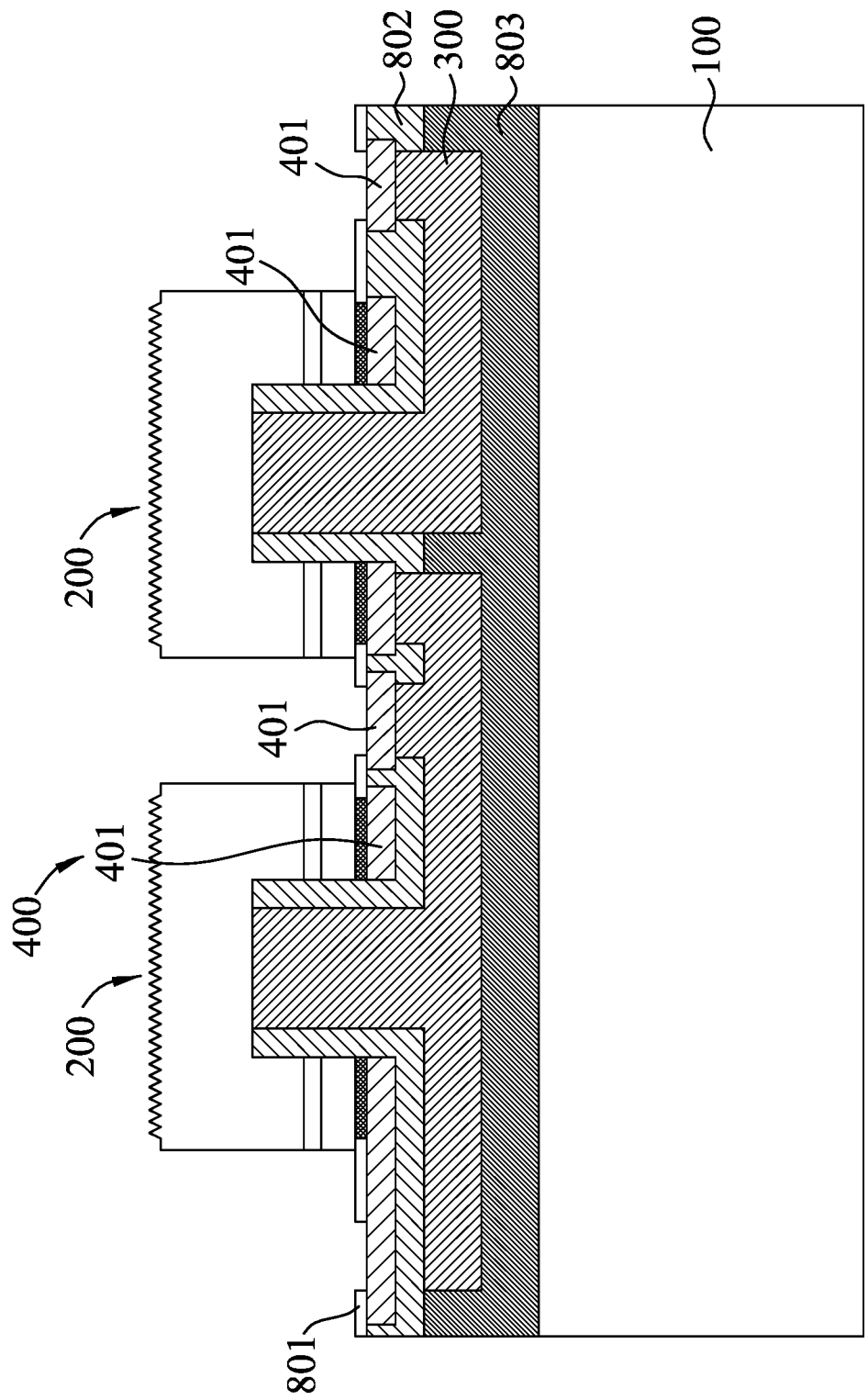

Specifically, referring to FIG. 20, the first insulating film 801 is etched to expose the ohmic contact units 401.

Figure 21:
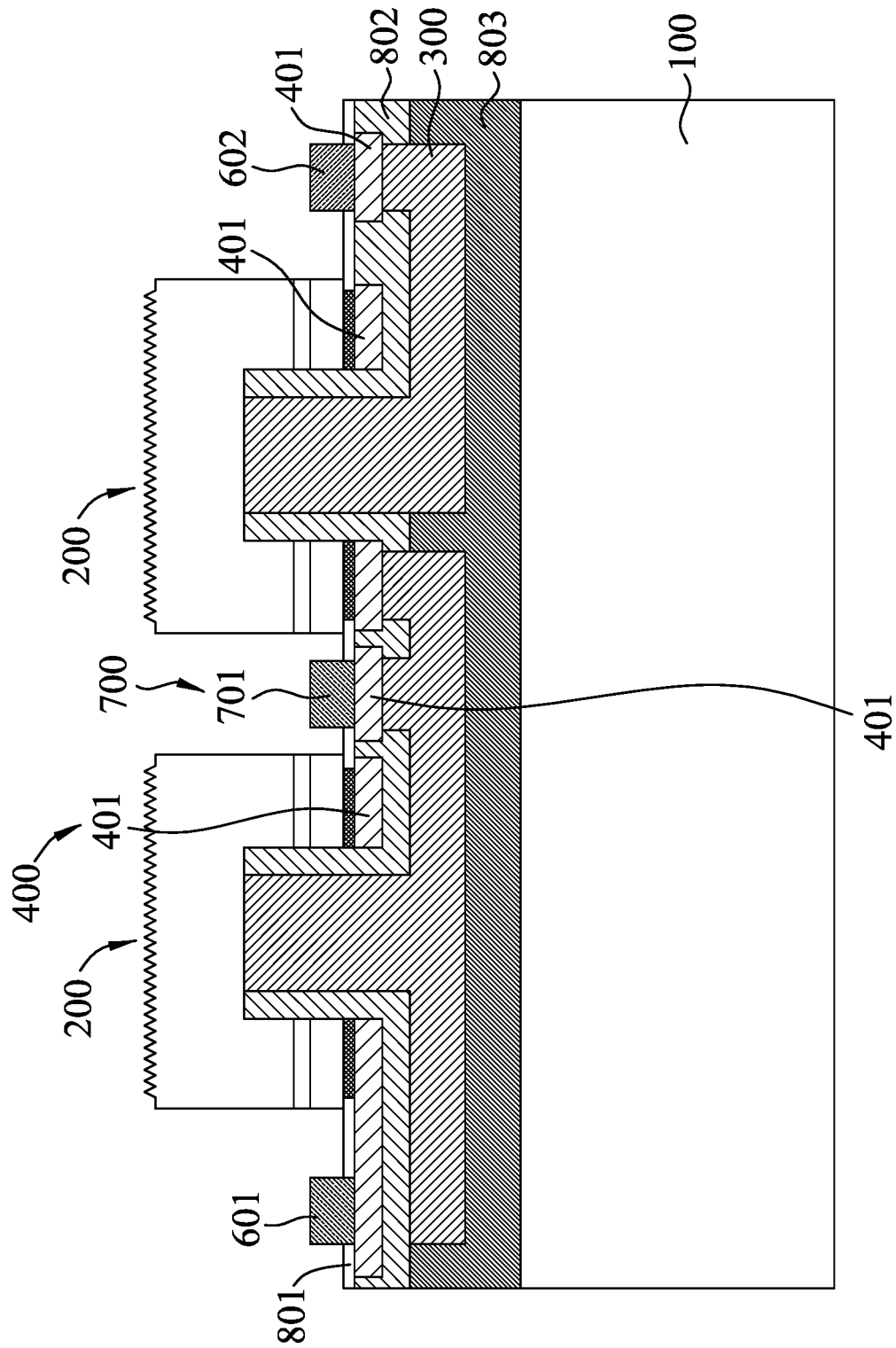

FIG. 21 shows that the first electrode 601, the second electrode 602 and the auxiliary electrode structure 700 are formed to be electrically connected to the ohmic contact structure 400. It should be noted that, although only one auxiliary electrode 701 is shown in FIG. 21, the number of the auxiliary electrode 701 may be changed according to the number of the light-emitting units 200 and the practical applications of the light-emitting device.

Figure 22:
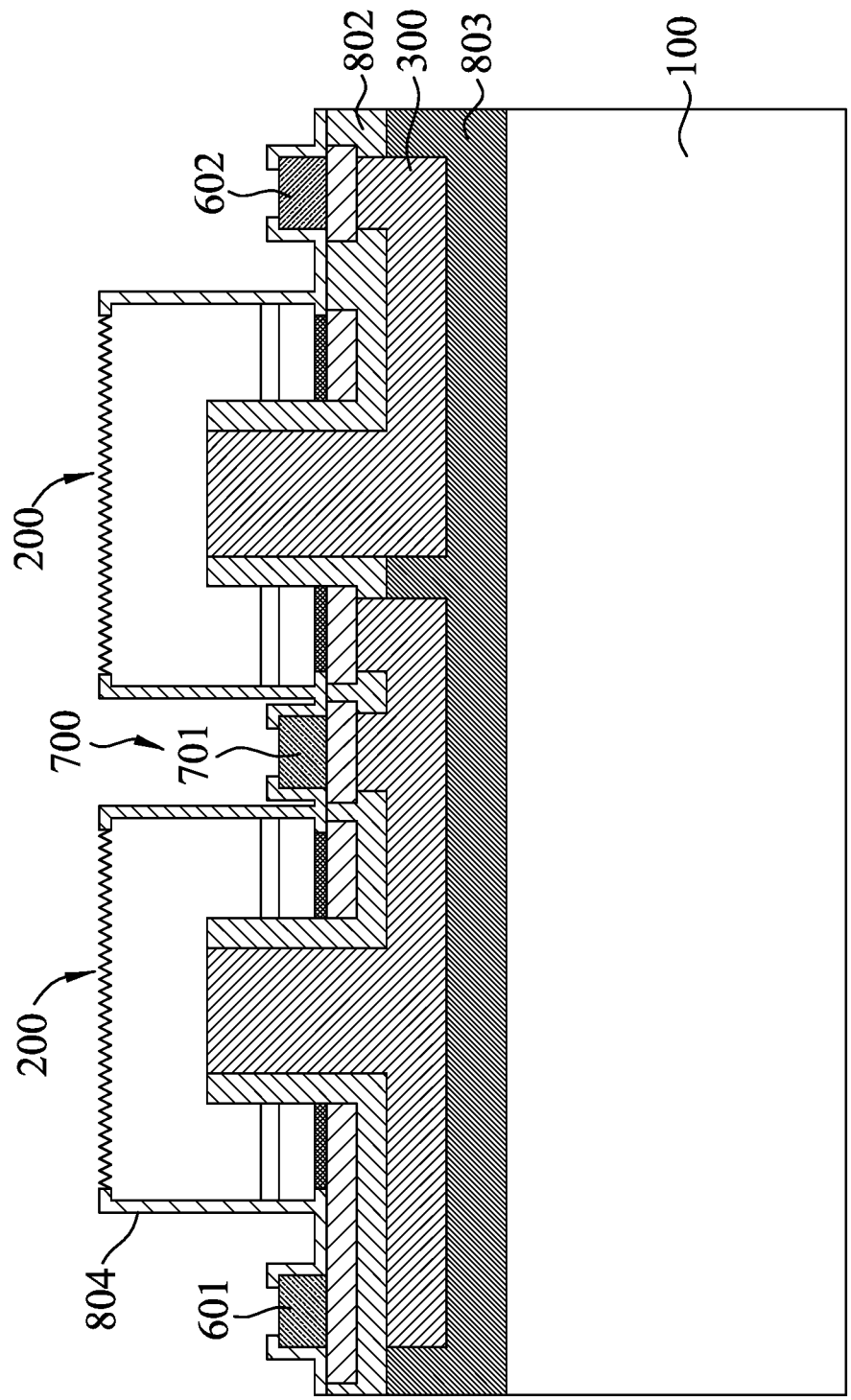

Referring to FIGS. 11 and 22, finally, a passivation layer 804 may be formed to partially cover the light-emitting units 200, the first electrode 601, the second electrode 602 and the auxiliary electrode structure 700, and the light-emitting device in accordance with some embodiments of this disclosure is obtained.

It should be noted that the abovementioned method can be modified for making any one of the light-emitting devices shown in FIGS. 1 to 10.

In an experimental example of this disclosure, a plurality of the light-emitting devices shown in FIG. 1 were tested. Each of the light-emitting devices includes a plurality of the light-emitting units 200 each having a dimension of 2.236 mm*2.236 mm. A forward bias (VF4) was applied to each of the light-emitting devices for detecting the leakage current (Ir) of the light-emitting device. The pass condition was set to be Ir<0.1 µA when VF4>4.2 V. The test results showed that 6530 of the light-emitting devices passed the test when only the first and second electrodes 601, 602 of each of the light-emitting devices are used for testing. However, in a new test method, when individually testing the light-emitting units 200 of each of the light-emitting devices using the first electrode 601, the second electrode 602 and the auxiliary electrodes 701, there were 6499 of the light-emitting devices which passed the test, and there were 31 of the light-emitting devices which had leaking light-emitting units 200. By using the new test method, the failure rate of the light-emitting devices is about 0.47%, which was calculated by (6530−6499)/6530*100%.

Therefore, the first electrode 601, the second electrode 602 and the auxiliary electrodes 701 of the auxiliary electrode structure 700 according to this disclosure can be used for individually testing the light-emitting units 200, ensuring the defective light-emitting units are discovered accurately.

In the description above, for the purposes of explanation, numerous specific details have been set forth in order to provide a thorough understanding of the embodiments. It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:
1. A light-emitting device comprising:
a substrate;
a number (N) of light-emitting units that are disposed on said substrate and that are spaced apart from each other, each of said light-emitting units having a light-emitting stack that has a first semiconductor layer, an active layer, and a second semiconductor layer which has a doping type opposite to said first semiconductor layer, and an upper surface that is a light exiting surface, the number (N) being not smaller than two;
an interconnect structure that electrically interconnects the light-emitting units and that is located underneath said first semiconductor layer of said light-emitting stack of each of said light-emitting units;
a first electrode that is electrically connected to said first semiconductor layer of a first one of said light-emitting units;

a second electrode that is electrically connected to said second semiconductor layer of an Nth one of said light-emitting units; and an auxiliary electrode structure that is electrically connected to said interconnect structure, that includes a top surface being opposite to said substrate being exposed from said interconnect structure, and being spaced apart from said upper surface of said second semiconductor layer of each of said light-emitting units in a direction transverse to a thickness direction of said light-emitting units, and that is adapted for connection with a testing apparatus for testing said light-emitting device;

wherein the interconnect structure has a first extension portion that extends into an inside of each of said light-emitting units to electrically connect said second semiconductor layer of each of said light-emitting units and a second extension portion extends to an adjacent one of said light- emitting units;

wherein a first ohmic contact structure is interposed between said second extension portion and said auxiliary electrode structure and a second ohmic contact structure is interposed between said second extension portion and said first semiconductor layer of said adjacent one of said light-emitting units to provide electrical connections.

2. The light-emitting device as claimed in claim 1, wherein said auxiliary electrode structure is located among said light-emitting units.

3. The light-emitting device as claimed in claim 1, wherein said first and second electrodes are disposed on said substrate, said first electrode being located at a side of a first one of said light-emitting units, said second electrode being located at a side of an $N^{th}$ one of said light-emitting units.

4. The light-emitting device as claimed in claim 1, wherein said auxiliary electrode structure includes at least a number (N-1) of auxiliary electrodes, each of said at least (N-1) auxiliary electrodes having a portion of said top surface of said auxiliary electrode structure.

5. The light-emitting device as claimed in claim 4, wherein:

an $i^{th}$ one of said auxiliary electrodes is electrically connected to said light-emitting stack of an $i^{th}$ one of said light-emitting units and to said light-emitting stack of an $(i+1)^{th}$ one of said light-emitting units; and i is a variable that takes on an integer value ranging from 1 to (N-1).

6. The light-emitting device as claimed in claim 5, wherein the $i^{th}$ one of said auxiliary electrodes is electrically connected to said second semiconductor layer of the $i^{th}$ one of said light-emitting units and to said first semiconductor layer of the (i+1) th one of said light-emitting units.

7. The light-emitting device as claimed in claim 6, wherein a first one of said auxiliary electrodes is located at a side of a first one of said light-emitting units.

8. The light-emitting device as claimed in claim 6, wherein:

a first one of said auxiliary electrodes is located between first and second ones of said light-emitting units; and said auxiliary electrodes other than a first one of said auxiliary electrodes are respectively disposed on said light-emitting stacks of said light-emitting units other than a first one of said light-emitting units.

9. The light-emitting device as claimed in claim 8, wherein said auxiliary electrodes other than said first one of said auxiliary electrodes are respectively disposed on said second semiconductor layers of said light-emitting stacks of said light-emitting units other than said first one of said light-emitting units.

10. The light-emitting device as claimed in claim 5, wherein one of said auxiliary electrodes is located at a side of a corresponding one of said light-emitting units, and is electrically connected to said first semiconductor layer of said corresponding one of said light-emitting units.

11. A light-emitting device comprising:

a substrate;

a number (N) of light-emitting units that are disposed on said substrate and that are spaced apart from each other, each of said light-emitting units having a light-emitting stack that has a first semiconductor layer, an active layer, and a second semiconductor layer which has a doping type opposite to said first semiconductor layer, the number (N) being not smaller than two;

a plurality of interconnect structures that are spaced apart from each other underneath said first semiconductor layer of said light-emitting stack of each of said light-emitting units; and an auxiliary electrode structure that is electrically connected to one of said interconnect structures, and that is adapted for connection with a testing apparatus for testing said light-emitting device;

wherein each of said interconnect structures is disposed beneath a respective one of said light-emitting units, and has an extension portion that extends into an inside of the respective one of said light-emitting units to penetrate said first semiconductor layer and said active layer and electrically connect said second semiconductor layer inside the respective one of the said light-emitting units, and a second extension portion that extends to an adjacent one of said light-emitting units and that is located beneath and connects said first semiconductor layer of said adjacent one of said light-emitting units;

wherein said second extension portion of each of said interconnect structures has a section between the respective one of said light-emitting units and the adjacent one of said light-emitting units, and said auxiliary electrode structure is electrically connected to said section of said second extension portion and one of an ohmic contact unit of a plurality of ohmic contact units of an ohmic contact structure is interposed between said section of said second extension portion and said auxiliary electrode structure to provide an electrical connection.

12. The light-emitting device as claimed in claim 11, further comprising the ohmic contact structure that is formed below said first semiconductor layers of said light-emitting units and above said interconnect structures, and that has the plurality of ohmic contact units electrically isolated from each other, some of said ohmic contact units being respectively electrically connected to said first semiconductor layers of said respective one and said adjacent one of said light-emitting units.

13. The light-emitting device as claimed in claim 11, further comprising:

a first electrode that is electrically connected to a first one of said light-emitting units; and a second electrode that is electrically connected to an $N^{th}$ one of said light-emitting units.

* * * * *